(12) United States Patent
Liu et al.

(10) Patent No.: US 7,674,718 B2
(45) Date of Patent: Mar. 9, 2010

(54) METHOD FOR FORMING SPACERS OF DIFFERENT SIZES

(75) Inventors: Chia-Ho Liu, Hsinchu (TW); Chieh-Yu Tsai, Taipei (TW); Wei-Chen Lin, Taipei County (TW); Chia-Ying Lin, Taitung County (TW)

(73) Assignee: United Microelectronics Corp., Hsin-Chu (TW)

( * ) Notice: Subject to any disclaimer, the term of this patent is extended or adjusted under 35 U.S.C. 154(b) by 93 days.

(21) Appl. No.: 12/025,050

(22) Filed: Feb. 4, 2008

(65) Prior Publication Data

US 2009/0197417 A1 Aug. 6, 2009

(51) Int. Cl.
*H01L 21/302* (2006.01)
*H01L 21/461* (2006.01)

(52) U.S. Cl. ............... 438/706; 438/745; 438/311; 257/E21.32; 257/E21.227; 257/E21.218; 257/E21.229; 257/E21.278; 257/E21.293

(58) Field of Classification Search ........... 438/474, 438/513, 706, 745, 743, 744, 311
See application file for complete search history.

(56) References Cited

U.S. PATENT DOCUMENTS

| 6,242,350 | B1 | 6/2001 | Tao et al. |
| 6,764,955 | B2 * | 7/2004 | Jeon et al. .................. 438/704 |
| 6,773,996 | B2 * | 8/2004 | Suzawa et al. ............... 438/279 |
| 7,214,626 | B2 | 5/2007 | Huang |
| 7,224,028 | B2 * | 5/2007 | Suzawa et al. ............... 257/344 |

* cited by examiner

*Primary Examiner*—David Nhu
(74) *Attorney, Agent, or Firm*—Winston Hsu

(57) ABSTRACT

A method for forming spacers of different sizes includes the following steps. First a substrate is provided, which has a first element, a second element, a first material layer and a second material layer thereon. A first dry etching is performed to remove part of the second material layer to form a first spacer by the first element and to form a second side wall by the second element, so that the first material layer between the first spacer and the second side wall is exposed to become a damaged first material layer. A trimming procedure is performed to trim the damaged first material layer. A mask is used to cover the first element, the first spacer and part of the first material layer then a wet etching is performed to remove the second side wall.

12 Claims, 6 Drawing Sheets

METHOD FOR FORMING SPACERS OF DIFFERENT SIZES

BACKGROUND OF THE INVENTION

1. Field of the Invention

The present invention relates to a method for forming spacers. More particularly, the present invention relates to a method for forming spacers of different sizes.

2. Description of the Prior Art

In the manufacture process of semiconductors, a pair of protective, self-aligned spacers is usually required to be formed by two sides of the elements in semiconductor devices. Spacers of different sizes are formed for different groups of elements depending on different situations. In order to go with the entire process, the method for forming spacers of different sizes is usually that spacers of uniform size are first formed for different groups of elements after a preliminary etching step, and spacers of different sizes are later formed for a specific group of elements after a secondary etching step.

Please refer to FIGS. 1-5, which illustrate the process for forming spacers of different sizes by two etching procedures. As shown in FIG. 1, there are different groups of elements, such as a first element 110 and a second element 120, formed on a substrate 101 in advance. In addition to the first element 110 and the second element 120, there is a thin oxide layer 130 covering the substrate 101, the first element 110 and the second element 120, a nitride layer 140 covering the thin oxide layer 130, as well as another oxide layer 150 covering the nitride layer 140.

As shown in FIG. 2, a first etching procedure is performed using the nitride layer 140 as an etching stop layer. By adjusting process parameters such as etching time, the first etching may remove part of the oxide layer 150, so that the remaining oxide layer 150 forms a first spacer 151 by the first element 110, and a second side wall 152 by the second element 120. Due to process uniformity and etching selectivity considerations, the total effect of the first etching will not only entirely remove the oxide layer 150 between the first spacer 151 and the second side wall 152, but will also expose part of the nitride layer 140 underneath, turning it into a damaged nitride layer 141 due to the attack of the first dry etching. Compared with the original nitride layer 140, the damaged nitride layer 141 is relatively loose and not dense.

Afterwards, a second selective etching is performed to form spacers of different sizes. Before the second selective etching, as shown in FIG. 3, a patterned photoresist 160 is usually used to cover the region which is not subject to the second etching, such as the specific group of the first element 110. Simultaneously, the patterned photoresist 160 also covers part of the damaged nitride layer 141.

At this point, as shown in FIG. 4, a wet etching is usually used as the second selective etching to remove the second side wall 152. Because the medium of the wet etching is liquid and only part of the damaged nitride layer 141 is covered by the patterned photoresist 160, the etchant of the wet etching will not only remove the second side wall 152, but will also etch the nearby first spacer 151 through the border of the photoresist 160 and the damaged nitride layer 141 by taking advantage of the loose damaged nitride layer 141. In such a way, as shown in the top view of FIG. 5, the region which is not intended to be subject to the second etching and covered by the patterned photoresist 160 is corroded by the etchant too, so that the originally symmetrical first spacer 151 turns into debris 151' after the photoresist 160 is removed. This is a structural defect beyond remedy for the elements and it seriously hinders following processes.

Because it is the loose damaged nitride layer 141 that causes the wet etchant to have the opportunity to damage the first spacer 151 of the first element 110, and further destroy the method for selectively forming spacers of different sizes, a modified method is therefore needed to prevent the unexpected behavior of etching from the second etching for selectively forming spacers of different sizes.

SUMMARY OF THE INVENTION

The present invention provides a modified method to form spacers of different sizes. Correction of the surface of the structure, a loose damaged nitride layer for example, which is damaged by the first dry etching, is performed in advance before the selective formation of spacers of different sizes to prevent the unexpected behavior of etching in the following procedure from affecting the final structural shape of the spacers.

A method for forming spacers of different sizes of the present invention first provides a substrate, which has a first element, a second element, a first material layer and a second material layer thereon. The first material layer covers the substrate, the first element and the second element, and the second material layer covers the first material layer. A first dry etching is performed to remove part of the second material layer to form a first spacer by the first element and to form a second side wall by the second element, so that the first material layer between the first spacer and the second side wall is exposed to become a damaged first material layer. A trimming procedure is performed to trim the damaged first material layer and to correct the looseness. A mask is used to cover the first element, the first spacer and part of the first material layer then a wet etching is performed to remove the second side wall. A third dry etching procedure is performed to remove part of the first spacer and part of the first material layer to form a second spacer so that the first spacer is larger than the second spacer.

Because a trimming procedure is provided after the first etching to restore the damaged first material layer to be dense again, unexpected behavior of etching in the following wet etching procedure can be prevented to ensure the correct final structural shape of the spacers.

These and other objectives of the present invention will no doubt become obvious to those of ordinary skill in the art after reading the following detailed description of the preferred embodiment that is illustrated in the various figures and drawings.

DETAILED DESCRIPTION

The present invention therefore provides a modified method to form spacers of different sizes. Correction of the material, which is damaged by the first etching, is performed in advance after the first etching to prevent the unexpected behavior of etching in the following procedure to ensure the correct final structural shape of the spacers.

Figure 1:
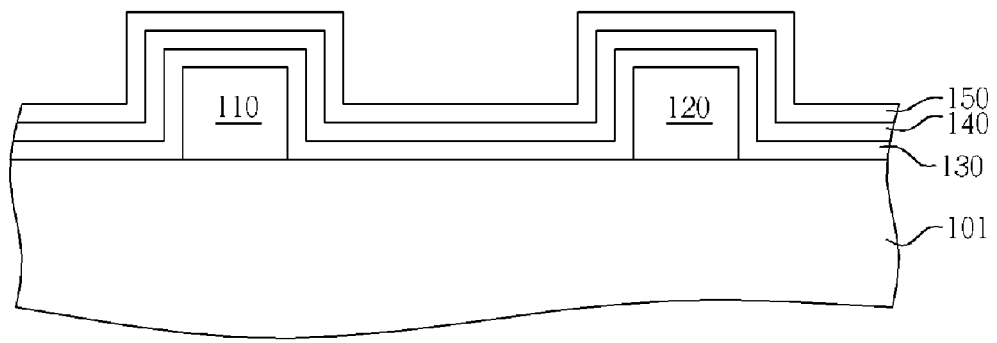
FIGS. 1-5 illustrate the prior art process for forming spacers of different sizes by two etching procedures.
Figure 2:
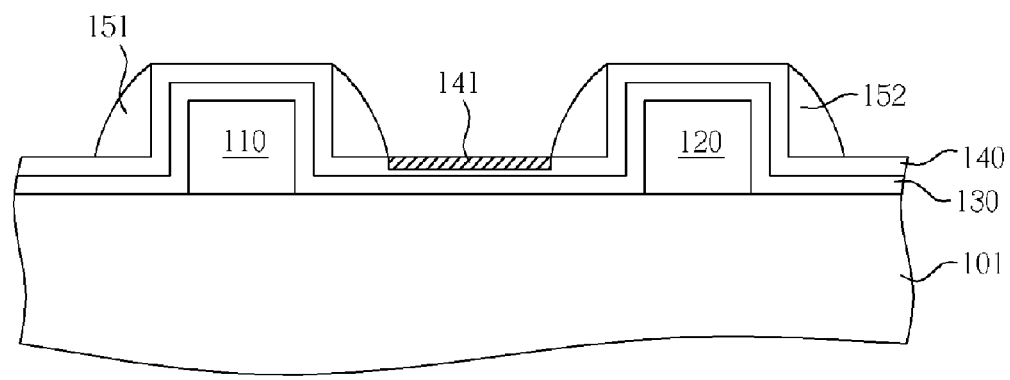
Figure 3:
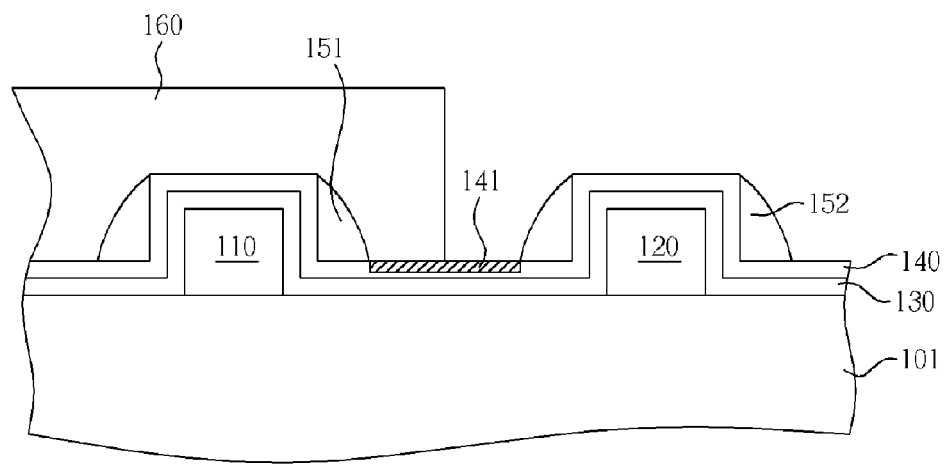
Figure 4:
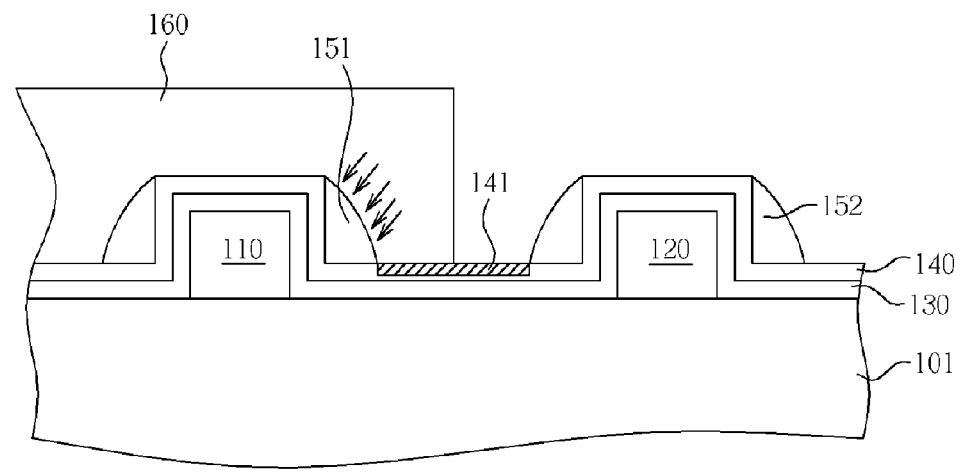
Figure 5:
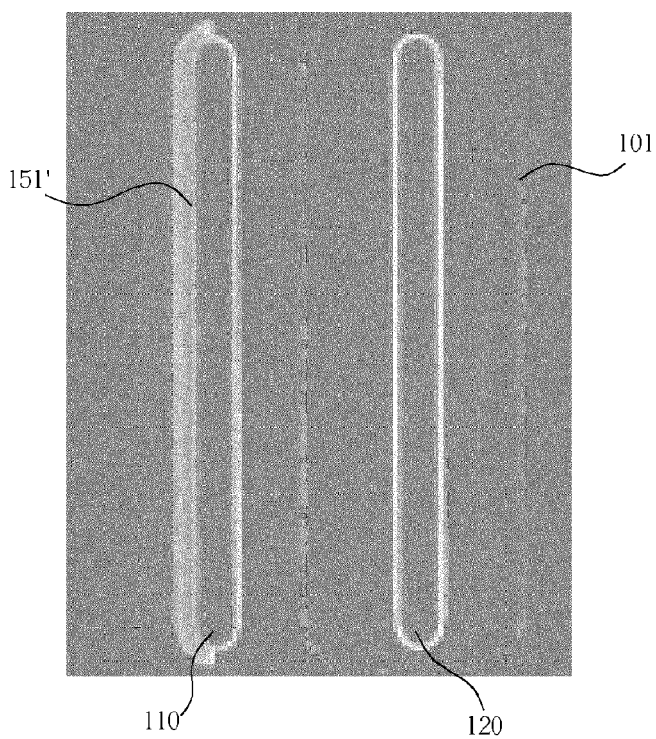
Figure 6:
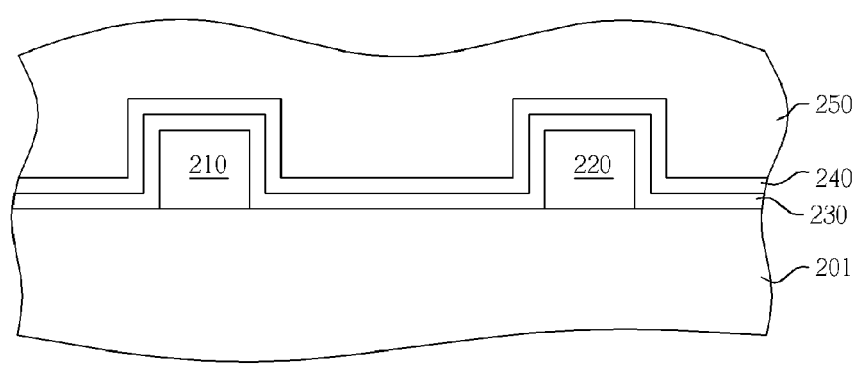
FIGS. 6-11 illustrate the method of forming spacers of different sizes of the present invention.

Please refer to FIGS. 6-11, illustrating the method of forming spacers of different sizes of the present invention. As shown in FIG. 6, first a substrate 201 is provided, on which there is a first element 210, a second element 220, a bottom oxide layer 230, a first material layer 240 and a second material layer 250 formed in advance. The bottom oxide layer 230 and the first material layer 240 together cover the substrate 201, the first element 210 and the second element 220. In addition, the second material layer 250 covers the first material layer 240.

The substrate 201 is usually a semiconductor substrate, such as a single crystal silicon wafer, or SOI. The first element 210 and the second element 220 may be semiconductor elements, such as a gate, and independently used in the same or different semiconductor devices. The bottom oxide layer 230, the first material layer 240 and the second material layer 250 may be formed by conventional methods, such as oxidation or deposition. The first material layer 240 may be a nitride or an oxide, and the second material layer 250 may also be a nitride or an oxide, as long as the first material layer 240 and the second material layer 250 each has different etching selectivity. The details will not be discussed here for brevity.

Figure 7:
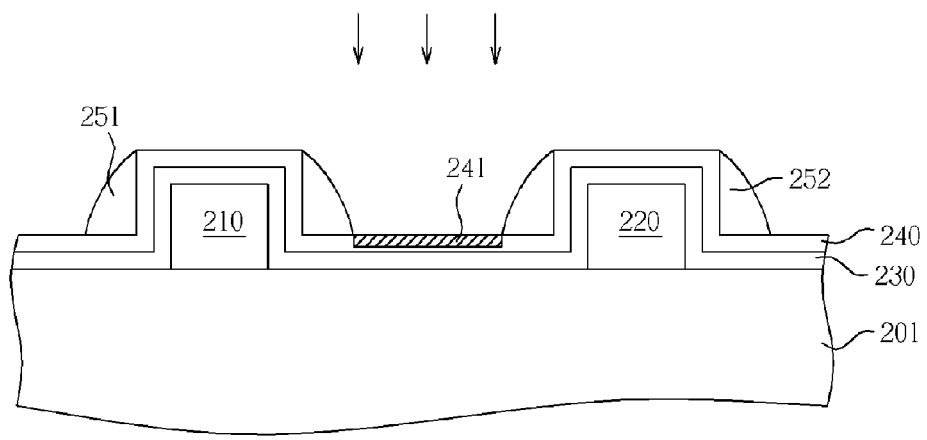

Later, as shown in FIG. 7, a first dry etching procedure is performed using the first material layer 240 as an etching stop layer. By adjusting process parameters such as etching time, part of the second material layer 250 may be removed, so that the remaining second material layer 250 forms a first spacer 251 by the first element 210 and a second side wall 252 by the second element 220. The conventional etching recipes may be employed to perform the first dry etching procedure depending on the material of the second material layer 250. Optionally, such first dry etching procedure may have the effect of soft etching.

Because the first material layer 240 is used as an etching stop layer in the first etching procedure to remove part of the second material layer 250, the first material layer 240 will be somewhat more or less exposed and damaged by the first etching procedure, in particular the region between the first spacer 251 and the second side wall 252, and will turn out to be a damaged first material layer 241. Compared with the original first material layer 240, the damaged first material layer 241 is relatively loose and not dense in texture, and therefore different from the first material layer 240 that is free from etching damage. Therefore, if no measurement is taken on the damaged first material layer 241 in time, in spite of the coverage of the patterned mask, the loose first material layer 241 will not be able to sustain the penetration of the etchant in the following wet etching procedure and will influence the neighboring first spacer 251 disadvantageously.

Figure 8:
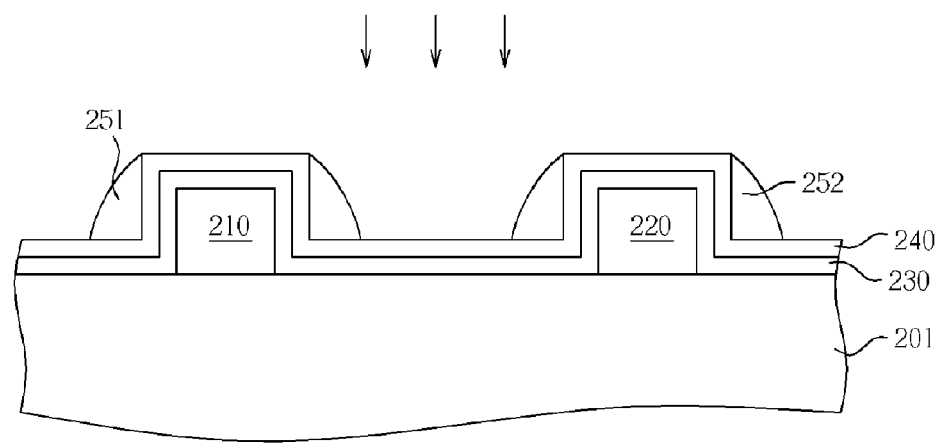

To correct the damaged first material layer 241, as shown in FIG. 8, the present invention suggests a trimming procedure to trim the damaged first material layer 241 and to correct the looseness. Such a trimming procedure is usually another dry etching procedure with special recipe having a high etching selectivity on the first material layer 240, so it will not substantially influence the first spacer 251 and the second side wall 252 during the removal of the damaged first material layer 241.

For example, if the first material layer 240 is silicon nitride and the second material layer 250 is silicon oxide, the trimming procedure may be carried out by using a fluoro-containing etchant and oxygen plus a carrier gas. Such fluoro-containing etchant may be SxFy, CxFy and/or NxFy. Oxygen can enhance the etching selectivity of the trimming procedure. Helium may be used as the carrier gas. For example, the trimming procedure may be carried out under certain conditions, such as a flow rate of 112 sccm-168 sccm, preferably 140 sccm, of the fluoro-containing etchant, a flow rate of 144 sccm-216 sccm, preferably 180 sccm, of the oxygen, a flow rate of 864 sccm-1296 sccm, preferably 1080 sccm, of the carrier gas, under a temperature of 32° C.-48° C., preferably 40° C., under a pressure of 1520 mT-2280 mT, preferably 1900 mT, and under a power of 620 W-930 W, preferably 775 W.

If the trimming procedure uses a GASONICS tool, different trimming recipes may be optionally used. A few of trimming recipes are illustrated below. All the unites are as listed above.

| Recipes | $O_2$ | $N_2$ | He | $CF_4$ | GST time | temperature | pressure | power |
|---|---|---|---|---|---|---|---|---|
| 1 | 180 | 0 | 1080 | 140 | 10 | 40 | 1900 | 775 |
| 2 | 195 | 0 | 933 | 130 | 10 | 40 | 1000 | 300 |

Figure 9:
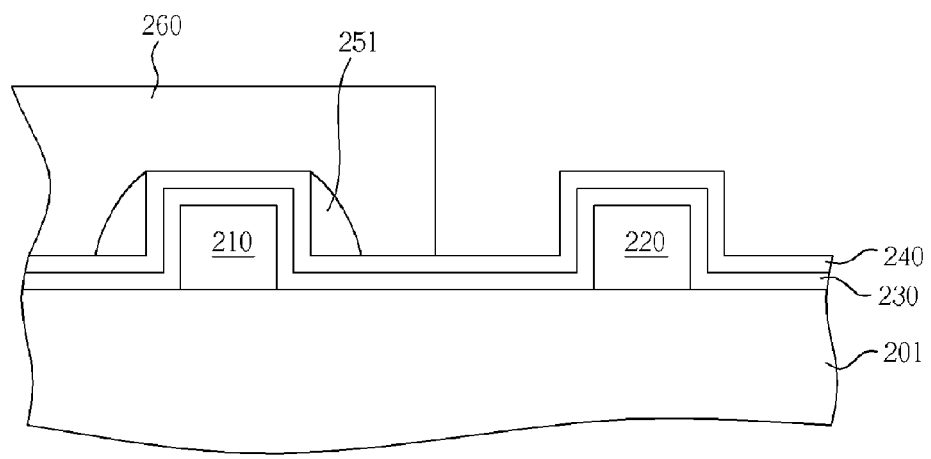

Afterwards, a mask 260 such as a patterned photoresist, as shown in FIG. 9, may be used to cover the first element 210, the first spacer 251 and part of the first material layer 240 to protect the first spacer 251 before the wet etching procedure. A wet etching procedure is then performed to remove the second side wall 252. If the second material layer 250 is silicon oxide, BOE may be used as the etchant. If such first dry etching procedure has the effect of soft etching, it may enhance the adhesion of the mask 260 to the first material layer 240.

Figure 10:
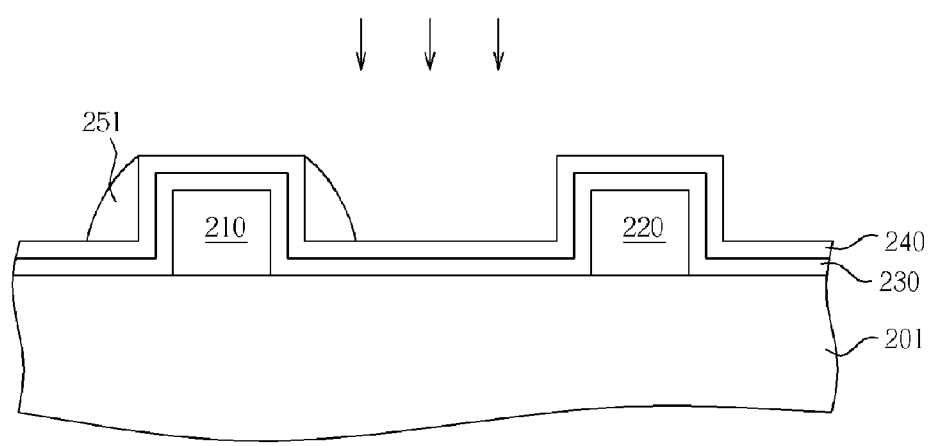
Figure 11:
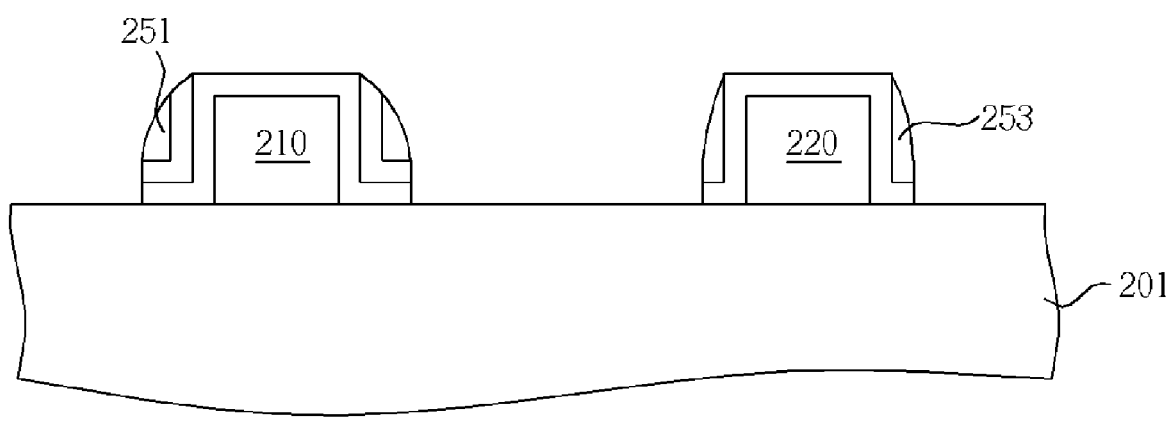

After the wet etching procedure is completed, as shown in FIG. 10, a third dry etching procedure may be performed after the mask 260 is removed. The third dry etching procedure will further remove part of the first material layer 251 and part of the first material layer 240, to form a second spacer 253 by the second element 220, as shown in FIG. 11. Because the first material layer 251 does not undergo the wet etching, the obtained first spacer 251 is larger than the obtained second spacer 253. The method of the present invention is complete.

Because a trimming procedure is provided after the first etching to render the damaged first material layer dense again, the unexpected behavior of etching and penetration in the following procedure may be avoided, to ensure the correct final structural shape of the spacers.

Those skilled in the art will readily observe that numerous modifications and alterations of the device and method may be made while retaining the teachings of the invention.

What is claimed is:

1. A method for forming spacers of different sizes, comprising:

providing a substrate with a first element and a second element thereon;

forming a first material layer covering said substrate, said first element and said second element;

forming a second material layer covering said first material layer;

performing a first dry etching to remove part of said second material layer to form a first spacer by said first element and to form a second side wall by said second element so that said first material layer between said first spacer and said second side wall is exposed to become a damaged first material layer;

performing a trimming procedure to trim said damaged first material layer;

using a mask to cover said first element, said first spacer and part of said first material layer; and performing a wet etching to remove the second side wall.

2. The method for forming spacers of different sizes of claim 1, wherein said trimming procedure is carried out by performing a second dry etching.

3. The method for forming spacers of different sizes of claim 2, wherein said second dry etching is carried out by using a fluoro-containing etchant and oxygen.

4. The method for forming spacers of different sizes of claim 3, wherein said fluoro-containing etchant comprises carbon.

5. The method for forming spacers of different sizes of claim 3, wherein said fluoro-containing etchant comprises sulfur.

6. The method for forming spacers of different sizes of claim 3, further comprising using helium.

7. The method for forming spacers of different sizes of claim 2, wherein said second dry etching is carried out under a temperature of 32° C.-48° C.

8. The method for forming spacers of different sizes of claim 2, wherein said second dry etching is carried out under a pressure of 1520 mT-2280 mT.

9. The method for forming spacers of different sizes of claim 2, wherein said second dry etching is carried out under a power of 620 W-930 W.

10. The method for forming spacers of different sizes of claim 1, wherein said first material layer is formed by a nitride.

11. The method for forming spacers of different sizes of claim 1, wherein said second material layer is formed by an oxide.

12. The method for forming spacers of different sizes of claim 1, further comprising:

removing said mask; and performing a third dry etching to remove part of said first spacer and to remove part of said first material layer to form a second spacer, so that said first spacer is larger than said second spacer.

* * * * *